(12) United States Patent
Kawamoto et al.

(10) Patent No.: US 7,957,710 B2
(45) Date of Patent: Jun. 7, 2011

(54) DCDC CONVERTER UNIT, POWER AMPLIFIER, AND BASE STATION USING THE SAME

(75) Inventors: Takashi Kawamoto, Kodaira (JP); Takashi Oshima, Moriya (JP); Taizo Yamawaki, Tokyo (JP); Manabu Nakamura, Akishima (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 569 days.

(21) Appl. No.: 12/216,092

(22) Filed: Jun. 30, 2008

(65) Prior Publication Data
US 2009/0011728 A1    Jan. 8, 2009

(30) Foreign Application Priority Data
Jul. 2, 2007    (JP) .................. 2007-174015

(51) Int. Cl.
H04B 1/04    (2006.01)
H04M 1/00    (2006.01)
(52) U.S. Cl. .................. 455/127.1; 455/561; 455/343.1
(58) Field of Classification Search .............. 455/127.1, 455/343.1, 343.2, 343.5, 561, 572, 311, 341
See application file for complete search history.

(56) References Cited

U.S. PATENT DOCUMENTS
| | | | |
|---|---|---|---|
| 6,256,482 B1 | 7/2001 | Raab | |
| 6,871,049 B2 * | 3/2005 | Sugar et al. | 455/103 |
| 6,993,299 B2 * | 1/2006 | Sugar et al. | 455/103 |
| 7,046,533 B2 * | 5/2006 | Takemura et al. | 363/65 |
| 7,116,946 B2 * | 10/2006 | Tanabe et al. | 455/91 |
| 7,116,947 B2 * | 10/2006 | Tanabe et al. | 455/91 |
| 7,899,414 B2 * | 3/2011 | Sugar et al. | 455/103 |

FOREIGN PATENT DOCUMENTS
| | | |
|---|---|---|
| JP | 11-127573 | 10/1997 |
| JP | 2005-277559 | 3/2004 |
| JP | 2006-211112 | 1/2005 |

OTHER PUBLICATIONS

Pierce Nagle et al., "A Wide-Band Linear Amplitude Modulator for Polar Transmitters Based on the Concept of Interleaving Delta Modulation", IEEE Journal of Solid-State circuits, vol. 37, No. 12, Dec. 2002, pp. 1748-1756.

* cited by examiner

*Primary Examiner* — Sonny Trinh
(74) *Attorney, Agent, or Firm* — Stites & Harbison PLLC; Juan Carlos A. Marquez, Esq.

(57) ABSTRACT

A DCDC converter includes a signal splitting unit that splits an input signal into N signal components; N DCDC converter elements that process individually the N split signals; and an adder that adds outputs from the plural DCDC converter elements to generate output signals. Each of the DCDC converter elements has an operation band narrower than an applicable frequency band of the input signal, and selects a design parameter that allows a conversion efficiency of the DCDC converter elements to be optimized for any band of the applicable frequency bands. For example, the parameter of a PMOS transistor and a NMOS transistor, which configure an inverter is designed to optimize the efficiency at any of frequency bands. The frequency band of the input signal is split, and each of the split outputs is input to a DCDC converter element that has a corresponding frequency and high efficiency characteristic.

20 Claims, 14 Drawing Sheets

DCDC CONVERTER UNIT, POWER
AMPLIFIER, AND BASE STATION USING
THE SAME

CLAIM OF PRIORITY

The present invention claims priority from Japanese patent application JP 2007-174015 filed on Jul. 2, 2007, the content of which is hereby incorporated by reference into this application.

FIELD OF THE INVENTION

The present invention relates to a DCDC converter unit, a power amplifier, and a base station, and in particular, to a base station that performs wireless communication using a broadband high-frequency signal, and a DCDC converter and a power amplifier suitable for the base station apparatus.

BACKGROUND OF THE INVENTION

A power amplifier that is used in a base station that performs wireless communication is required to have a small size and high efficiency in consideration of cost. Further, high speed and broadband communication is progressing in the wireless communication field such as mobile phones and a broadband and high efficiency power amplifier is required for a base station. Envelop elimination and restoration (EER), which is one of the methods used for addressing the above demands, is disclosed in U.S. Pat. No. 6,256,482B1.

Further, in JP-A-2006-211112, a broadband D/A converter that uses an EER method and a broadband power amplifier using the same are disclosed. According to JP-A-2006-211112, the broadband D/A converter splits an input digital envelope signal for every frequency band, and n D/A converters individually convert digital envelope signals into analog signals. Furthermore, the converted analog signals are up-converted at predetermined frequency bands by individual up-converters and then added by an adder to be transmitted as an analog envelope signal corresponding to the original digital envelope signal.

In JP-A-2005-277559, a broadband and high efficiency EER transmitter is disclosed. According to the configuration of the transmitter disclosed in JP-A-2005-277559, an amplitude component of a modulation signal is input to a power supply terminal of a high-frequency power amplifier and a phase component thereof is input to a high frequency wave input terminal of the high-frequency power amplifier. Further, a modulated wave that is modulated from the original modulation signal is obtained through an output of the high-frequency power amplifier. An output of any of plural DC-DC converters is selected according to the level of the amplitude component as a power supply voltage of the transmitter.

In JP-A-Hei 11(1999)-127573, a parallel operating apparatus of a DC/DC converter is disclosed. The parallel operating apparatus of a DC/DC converter includes plural DC/DC converters that can be operated simultaneously and connected in parallel to each other, a current detecting circuit that detects the total current output from an output terminal, and a DC/DC converter on/off control circuit that controls the number of DC/DC converters to be operated according to the amount of total current.

In "High-Linearity RF Amplifier Design" (written by Peter B. Kenington, Artech house, 2000, PP 124-126), an example of s configuration of a class-S amplifier is disclosed. With this configuration, a PMW signal is generated by comparing an input waveform with a triangular wave, and the PMW signal is amplified by an amplifier including a pair of transistors in which a diode is inserted between a collector and an emitter. Further, a desired output is obtained by a low pass filter.

SUMMARY OF THE INVENTION

An example of the EER amplifier disclosed in U.S. Pat. No. 6,256,482B1 is shown in FIG. 17. Amplitude information (AM signal) is extracted from a high frequency input signal by an envelope detector 15. Further, phase information of the input signal is extracted by a limiter 16. The amplitude information is amplified by a class-S amplifier 25 and then supplied to a power supply terminal of a carrier amplifier 17. Further, the phase information is supplied to an input terminal of the carrier amplifier 17. Even though the amplitude information of the input signal is temporarily absorbed by the limiter 16, since the amplitude information is supplied to the power supply terminal of the carrier amplifier 17, the absorbed amplitude information is recovered by the carrier amplifier 17. Further, because the carrier amplifier 17 of the EER amplifier 26 shown in FIG. 17 is designed to always be saturated regardless of the input power, this results in the EER amplifier having a high efficiency. However, in order to make the entire EER amplifier 26 highly effective, the DCDC converter that amplifies the amplitude information needs to have high efficiency, in addition to the carrier amplifier 17. In U.S. Pat. No. 6,256,482B1, the class-S amplifier 25 serves as a DCDC converter.

Even though the amplitude information has a frequency lower than the phase information, in a broadband system such as a worldwide interoperability for microwave access (WiMAX), the applicable frequency band reaches several tens of MHz and the maximum transmission rate reaches 75 Mbps. In case of the class-S amplifier that amplifies the amplitude information, as the operating frequency becomes higher, the power efficiency becomes lowered. Further, the operating frequency band that is capable of obtaining efficiency applicable to the EER amplifier suitable for the base station is several hundreds of kHz to several MHz. Therefore, it is difficult to use the class-S amplifier for the high speed and broadband system such as WiMAX. That is, if the frequency of the input signal becomes higher, W/L of a MOS transistor needs to be large in order to allow a PMOS transistor and an NMOS transistor, which configure an inverter of the class-S amplifier to correspondingly comply with the frequency. Further, a large-sized MOS transistor is required. However, if the W/L of the transistor becomes larger, a peak value of a pass-through current that flows in the inverter becomes larger, which lowers the efficiency of the class-S amplifier.

Further, if the W/L becomes larger, even though an on-state resistance of the MOS transistor becomes smaller, the gate capacity becomes larger. Therefore, when a frequency band signal that is lowered by the gate capacity is output from a comparator, the efficiency of the class-S amplifier becomes lowered. As a result, even though the W/L of the PMOS transistor and the NMOS transistor, which configure the inverter, is sufficiently high, if the frequency of the input signal is high as compared with the W/L, the inverter cannot be driven with the output signal of the comparator with the square wave, which lowers the efficiency of the class-S amplifier.

On the other hand, if the frequency of the input signal is low, when a PMOS transistor and an NMOS transistor having a large W/L are used for the inverter, the pass-through current becomes larger, which lowers the efficiency.

As described above, when the class-S amplifier is used as a DCDC converter, the class-S amplifier is not suitable for amplifying the amplitude information of a wireless communication system having a high transmission rate and a wide applicable frequency band, such as WiMAX. That is, in case of a broadband wireless communication system, the class-S amplifier that is a DCDC converter needs to operate with a low efficiency but at a high frequency band.

The broadband D/A converter disclosed in JP-A-2006-211112 converts individually digital envelope signals that are divided for every frequency band by a band divider into analog signals. The D/A converter includes a frequency converter that multiplies the individual analog signals by a sine wave to be up-converted. Further, the D/A converter D/A-converts the broadband envelope signals. However, during the up-converting to the IP frequency band, when the sine wave is multiplied with the analog signals, the operation in a non-saturated area, that is, the overlapping of the current component and the voltage component cannot be avoided, which causes a large power loss. Therefore, it is difficult to ensure high efficiency in the power amplifying apparatus that uses the D/A converter. Further, the band divider shifts the frequency so as not to include frequency signals of 5000 Hz or larger such that the divided output signals has the same low frequency band, for example, an operating rate of 5000 Hz. However, when using this process, it is difficult to efficiently amplify the amplitude information of a wireless communication system with high speed and wide applicable frequency band such as WiMAX.

Furthermore, the apparatus disclosed in JP-A-2005-277559 or JP-A-Hei 11(1999)-127573 includes plural DC-DC converters connected in parallel to each other. However, since the input signal is processed by any of the DC-DC converters, the amplifier for a signal having a high speed and wide frequency band decreases in efficiency.

An object of the present invention is to provide a DCDC converter unit that has a high efficiency for a high speed and broadband input signal, a power amplifier applicable to a wireless communication system using the same, and a base band using the same.

Further, another object of the present invention is to provide a broadband and high efficiency DCDC converter unit that is capable of applying to a terminal, and etc. and an amplifier using the same.

An exemplary embodiment of the invention will be described. A DCDC converter unit according to the exemplary embodiment includes a signal splitting unit that splits an input signal into plural signal components; plural DCDC converter elements each of that has different characteristics for frequency bands; and an adder that adds outputs from the plural DCDC converter elements to generate an output signal. Each of the plural signal components may be input to any of the DCDC converter elements that has a characteristic corresponding to a frequency of the corresponding signal component.

According to the present invention, it is possible to provide a highly efficient and broadband DCDC converter unit (Hereafter, it is written as a DCDC converter) and a power amplifier that is capable of being applied to a high speed and broadband wireless communication system.

DETAILED DESCRIPTION OF THE PREFERRED EMBODIMENTS

Due to the demand for a high speed and broadband communication, the present invention uses an idea that a DCDC converter unit whose input signal has a lower frequency is more efficient and there is a design parameter that optimizes the efficiency of the DCDC converter according to the band of the input signal.

According to an exemplary embodiment of the present invention, a DCDC converter includes a signal splitting unit that splits an input signal into plural signal components; plural DCDC converter elements that have different characteristics for frequency bands; and an adder that adds outputs from the plural DCDC converter elements to generate output signals. Each of the plural DCDC comparator elements has an operation band narrower than an applicable frequency band of the input signal, and selects a design parameter that allows a conversion efficiency of the DCDC converter elements to be optimized for any band of the applicable frequency bands. That is, the components of each of the DCDC converter elements, for example, a triangle wave generated by a triangle wave generating unit and the input signal component are compared by a comparator. Therefore, according to the comparison result, at least one of parameters of a PMOS transistor and a NMOS transistor which configure an inverter that inversely amplifies and outputs a square wave output from the comparator and a parameter of a filter that extracts and outputs an output waveform passing through a predetermined frequency band within an applicable frequency band from the output waveform from the inverter is set to allow the efficiency to be optimized for any of the frequency bands of the input signal and to control the total applicable frequency band for the entire DCDC converter.

Specifically, the inverter and the filter have a parameter that the efficiency of each of the DCDC converter elements at a predetermined frequency band is better than the efficiency at the other frequency band within the applicable frequency band. The frequency band of the input signal is split, and each of the split outputs is input to a DCDC converter element that has a corresponding frequency and high conversion efficiency characteristic.

Therefore, by increasing the efficiency of the DCDC converter elements, it is possible to improve the efficiency of the entire DCDC converter, and realize the DCDC converter having improved efficiency as compared with the related art that processes the broadband input signal by a single DCDC converter element.

Hereinafter, exemplary embodiments of the invention will be described in detail with reference to the accompanying drawings.

First Embodiment

Figure 1:
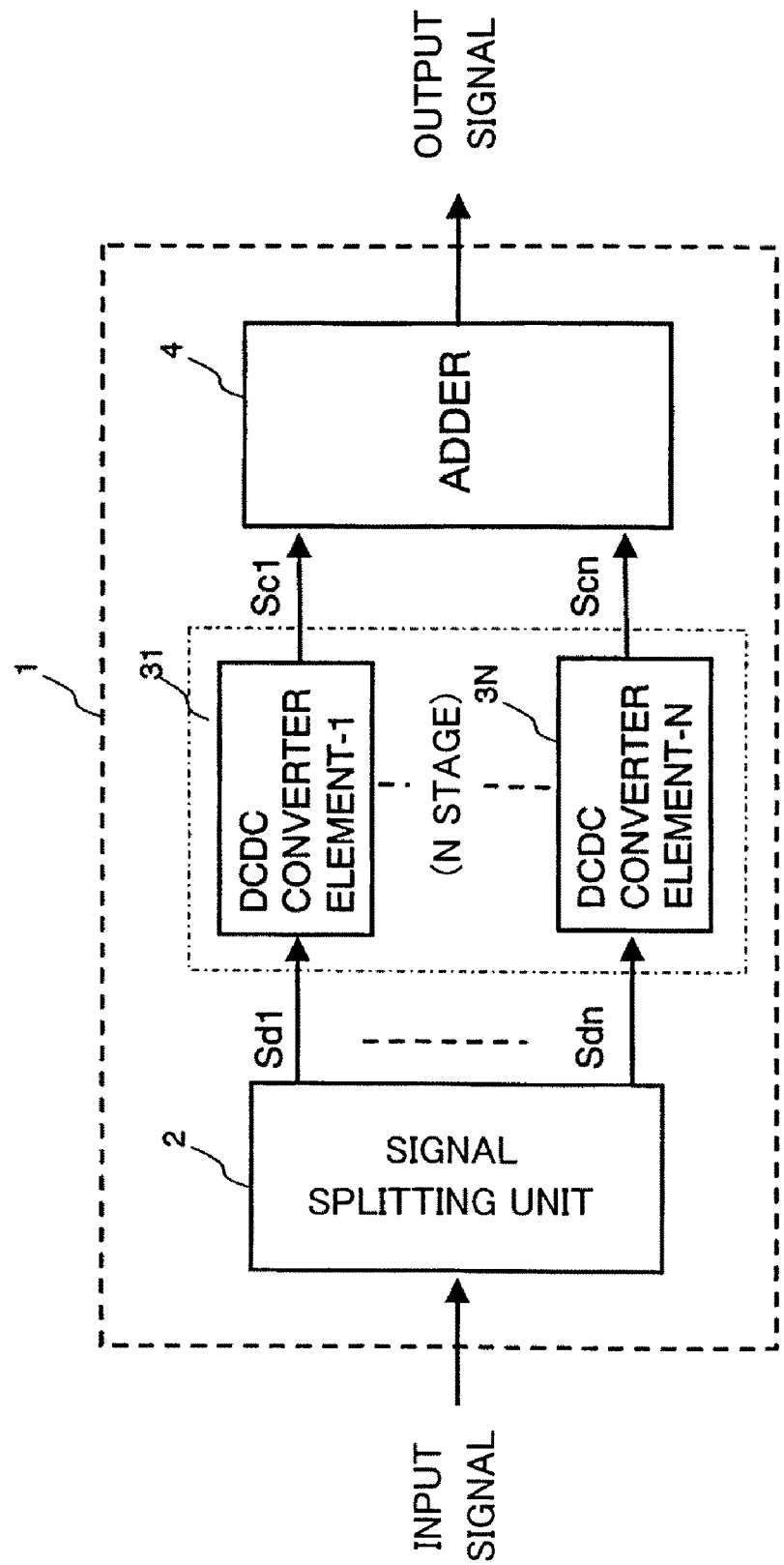
FIG. 1 is a block diagram showing a DCDC converter according to a first embodiment of the present invention.

A DCDC converter according to a first embodiment of the present invention will be described with reference to FIGS. 1 to 5. FIG. 1 is a block diagram showing a DCDC converter according to the first embodiment of the invention and FIG. 2 is a circuit diagram showing a DCDC converter element shown in FIG. 1.

A DCDC converter 1 includes a signal splitting unit 2 that splits an input signal into N signal components Sd (Sd1 to Sdn), N DCDC converter elements 31 to 3N that process N signal components that are split by the signal splitting unit 2 and have different characteristics for frequency bands, and an adder 4 that adds outputs Sc (Sc1 to Scn) of the N DCDC converter elements.

Figure 2:
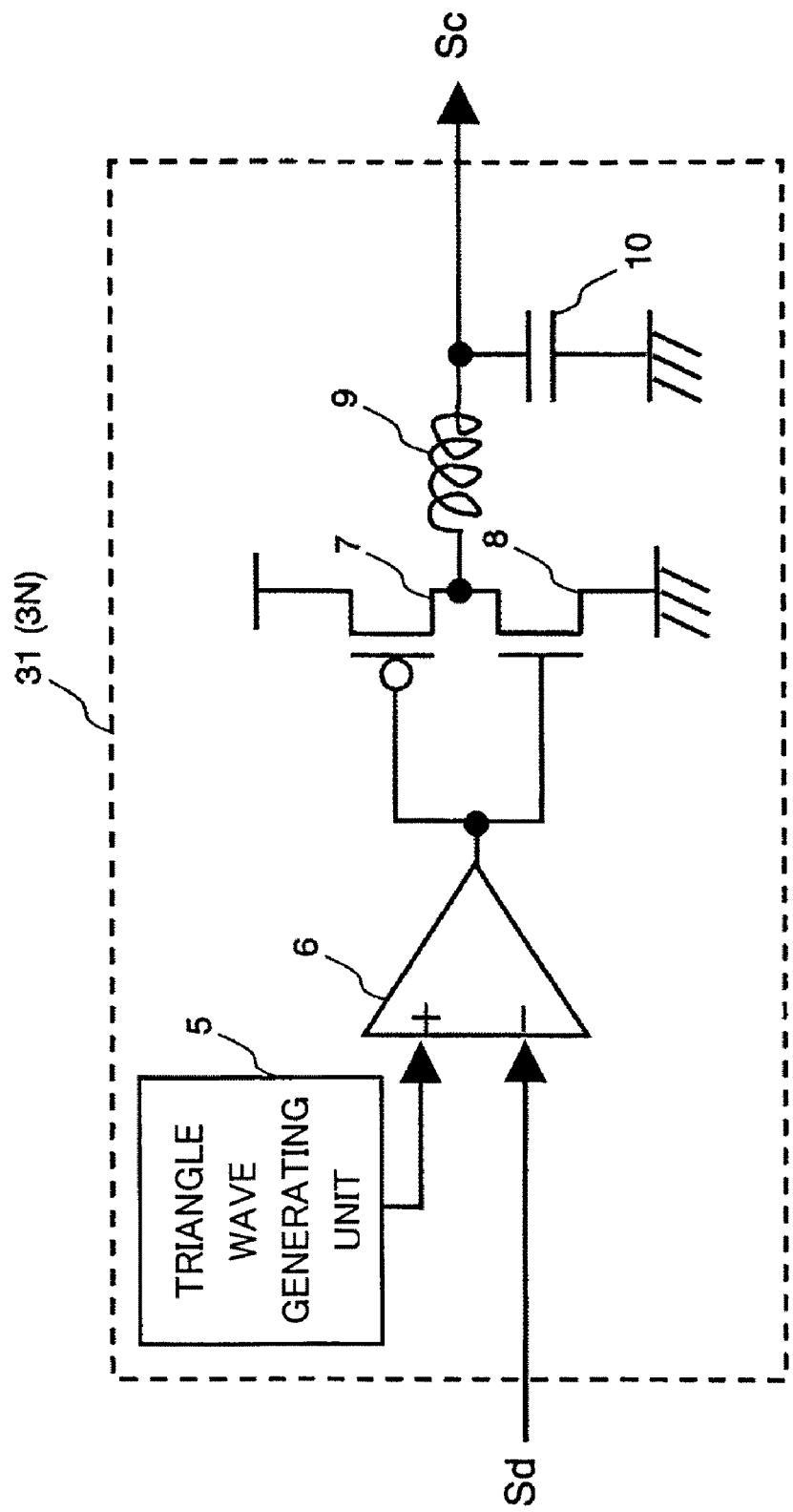
FIG. 2 is a circuit diagram showing a DCDC converter element of the DCDC converter shown in FIG. 1.

Class-S amplifiers shown in FIG. 2 serve as each of the DCDC converter elements 31 to 3N. Each of the plural DCDC converter elements has high efficiency at a predetermined frequency band. Further, the entire DCDC converter elements 31 to 3N are configured so as to control the entire applicable frequency bands. Each of the operating band of the DCDC converter elements is narrower than the applicable frequency bands, and a design parameter is selected so as to optimize the efficiency of each of the DCDC converter elements at any of the applicable frequency bands.

Referring to FIG. 2, each of the class-S amplifiers that configures each of the DCDC converter elements 31 to 31N includes a triangle wave generating unit 5 that generates a low frequency band triangle wave signal having a frequency component that is predetermined times a frequency of the input signal component Sd, a comparator 6 that compares an input signal component with the triangle wave to output a square wave, a PMOS transistor 7 and a NMOS transistor 8, which configure an inverter, and a coil 9 and a capacitor 10, which configure a filter having a predetermined pass band set for every DCDC converter element. A signal Sc obtained by amplifying a pass band input signal component of the filter is output from each of the DCDC converter elements.

Since the MOS transistor, which configures the inverter, is completely turned on/off, not saturated, the DCDC converter elements can amplify the input signal with high efficiency.

As described above, the PMOS transistor 7 and the NMOS transistor 8, which configure the inverter, need to satisfactorily comply with a frequency of the triangular wave. Therefore, the W/L of the MOS transistor has to be large. However, if the W/L is larger, the peak value of the pass-through current that flows in the inverter becomes larger, which lowers the efficiency of the DCDC converter elements. Further, as a gate capacitance becomes larger, the efficiency of the DCDC converter elements is lowered. Therefore, the above needs to be taken into consideration. When the frequency of the input signal Sd is low, the W/L becomes smaller so as to make the pass-through current of the inverter small, which prevents the lowering of the efficiency.

As such, the efficiency of the DCDC converter elements is lowered as the frequency of the input signal becomes lower. However, a parameter that optimizes the efficiency according to the frequency band of the input signal, that is, a size of the PMOS transistor 7 and NMOS transistor 8 already exists.

According to the first embodiment, a broadband input signal is split into plural frequency band signal components. The DCDC converter elements 31 to 3N to which the frequency band signal components are input are designed to allow a parameter of components thereof, that is, the PMOS transistor and the NMOS transistor, which configure the inverter, to optimize the efficiency at the frequency band of the input signal components.

Referring to FIG. 1 again, output signals Sc of the DCDC converter elements 31 to 3N are added by the adder 4 so that a broadband signal obtained by amplifying the input signal is generated as an output signal.

Figure 3:
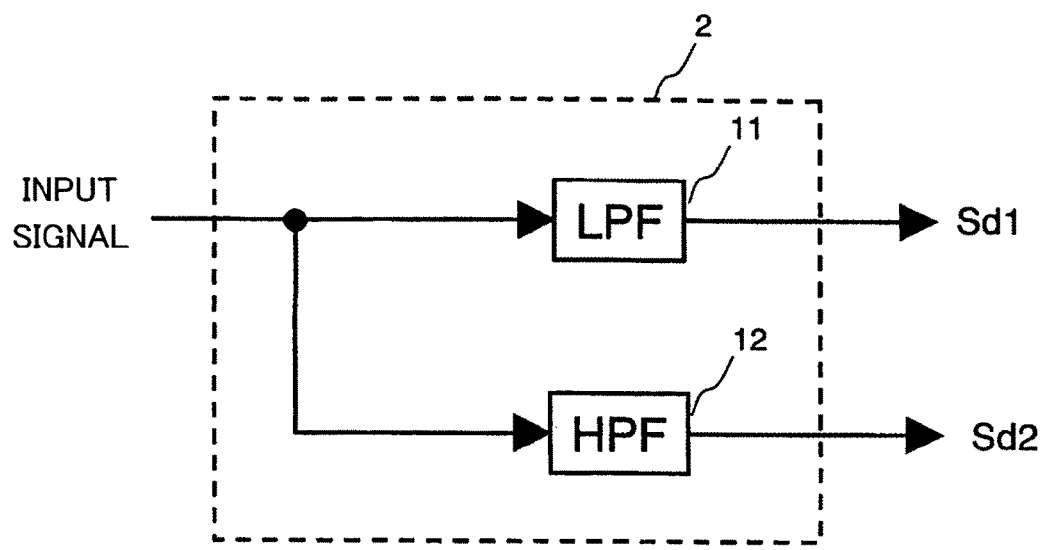
FIG. 3 is a diagram showing a configuration example of a signal splitting unit shown in FIG. 1.

FIG. 3 shows a first configuration example of the signal splitting unit 2 shown in FIG. 1. The signal splitting unit 2 includes a low pass filter 11 and a high pass filter 12. The input signal is input to the low pass filter 11 and the high pass filter 12 and output signals Sd1 and Sd2 of the filters serve as output signals of the signal splitting unit 2.

Next, an operation when the signal splitting unit 2 shown in FIG. 3 is applied to the DCDC converter according to the embodiment of the invention shown in FIG. 1 will be described.

Figure 4A:
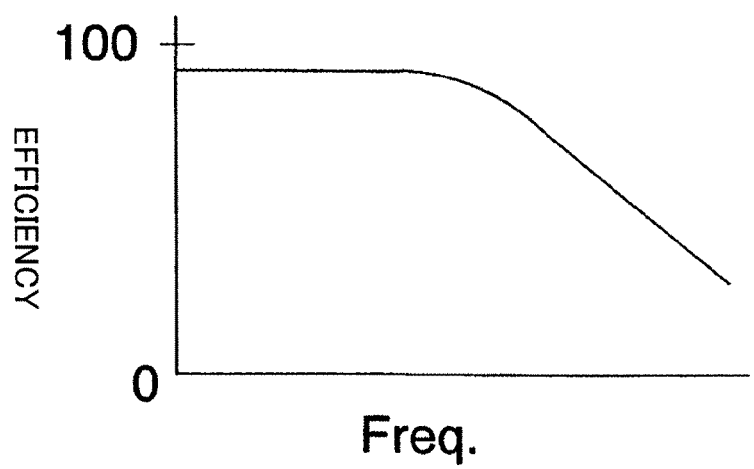
FIG. 4A is a diagram showing a relationship between an operating frequency and a power conversion efficiency of the DCDC converter.

As described above, in order to make the efficiency of the entire EER amplifier high, both the carrier amplifier and the DCDC converter that amplifies amplitude information need to have high efficiency. Even though the amplitude information has a lower frequency than the phase information, the upper limit of the applicable frequency band in the broadband wireless communication system such as worldwide interoperability for microwave access (WiMAX) reaches several tens of KMz. In the meantime, as shown in FIG. 4A, the DCDC converter has a characteristic that the power efficiency is rapidly lowered as the operating frequency (at the same interval) becomes higher.

In this embodiment, a frequency component of the input signal is split, and class-S amplifiers that correspond to the frequencies of the split signals respectively are used as DCDC converter elements, and the group of DCDC converter elements configures the DCDC converter. Therefore, the lowering of the power efficiency accompanied by the broadening of the operational frequency band can be prevented.

Figure 4B:
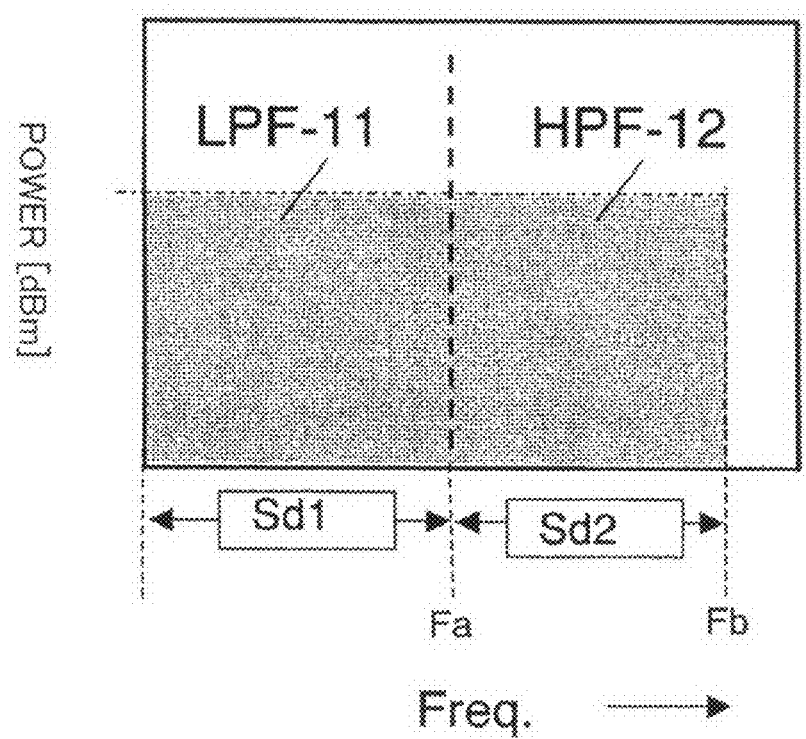
FIG. 4B is a diagram showing an input signal spectrum for explaining an operation of the signal splitting unit shown in FIG. 3.

FIG. 4B is a diagram showing that the band of the input signal is split by the signal splitting unit 2 shown in FIG. 3. The input signal having a predetermined band is input to the signal splitting unit 2 and then split into a low band component Sd1 that is lower than a frequency Fa and a high band component Sd2 that is higher than the frequency Fa and lower than a frequency Fb, by a low pass filter 11 and a high pass filter 12. The split signals are input to the DCDC converter elements 31 to 32. That is, an output signal Sd1 of the low pass filter 11 is input to the DCDC converter element 31 and an output signal Sd2 of the high pass filter 12 is input to the DCDC converter element 32.

As a result, an operating speed of the DCDC converter element 31 is low, and an operating speed of the DCDC converter 32 is high. Therefore, a parameter of each of the DCDC converter elements needs to be previously set so as to optimize the efficiency at each of the operating speeds.

Specifically, in case of the DCDC converter element 31 to which the low band component Sd1 is input, since the frequency band of the input signal is low, the triangle wave output from the triangle wave generating unit 5 of the DCDC converter element shown in FIG. 2 is a signal having a frequency component, which is predetermined times a frequency of the input signal. Therefore, the triangle wave is a low frequency band signal. The frequency component of the triangle wave is about fifty times the frequency component of the input signal, even though it may be varied depending on the wireless specification. The triangle wave and the input signal are compared by the comparator 6 to output the square wave. The inverter is required to process the square wave as a square wave.

In the DCDC converter element 31, the frequency band of the input signal Sd1, that is, the frequency band of the square wave is in the low range. Therefore, the size of the PMOS transistor 7 and the NMOS transistor 8, which configure the inverter of the DCDC converter element 31, is designed to have the minimum W/L that is capable of processing the square wave as the square wave. Therefore, the W/L is small. The low pass filter that is configured by the coil 9 and the capacitor 10 is designed to have a band that passes the input signal component and intercepts the triangle wave component. Accordingly, the DCDC converter element 31 is designed to process the low band input signal and optimize the efficiency.

Further, in case of the DCDC converter element 32 to which the high band component Sd2 is input, since the frequency band of the input signal Sd2 is high, the triangle wave output from the triangle wave generating unit of the DCDC converter element shown in FIG. 2 is a signal having a frequency component that is predetermined times a frequency of the input signal. Therefore, the triangle wave is a high frequency band signal. Similarly the DCDC converter element 31, in case of the DCDC converter element 32, the frequency component of the triangle wave is about fifty times the frequency component of the input signal, even though it may be varied depending on the wireless specification. The triangle wave and the input signal are compared by the comparator 6 to output the square wave. The inverter is required to process the square wave as a square wave. In the DCDC converter element 32, the frequency band of the square wave is high. Therefore, the size of the PMOS transistor 7 and the NMOS transistor 8, which configure the inverter, is designed to have the minimum W/L that is capable of processing the square wave as the square wave. Therefore, the W/L is large as compared with the inverter of the DCDC converter element 31. Further, the low pass filter that is configured by the coil 9 and the capacitor 10 is designed to have a band that passes the input signal component and intercepts the triangle wave component.

The output signals Sc1 and Sc2 of the DCDC converter elements 31 and 32 are added by the adder 4 so that a signal obtained by amplifying the input signal is generated as an output signal.

Accordingly, the efficiency of the DCDC converter element 32 that processes the high band component Sd2 of the input signal is the same as the related art, and the efficiency of the DCDC converter element 31 that processes the low band component Sd1 of the input signal becomes higher. As a result, the efficiency of the entire DCDC converter 1 is improved.

Figure 5:
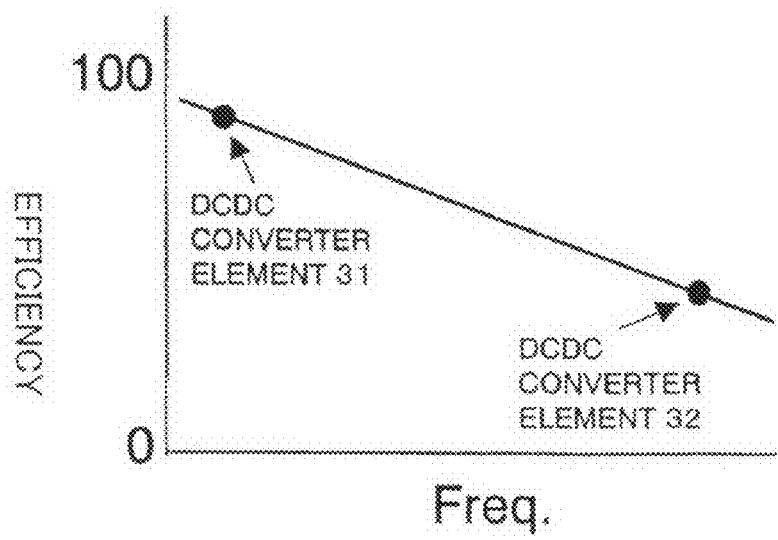
FIG. 5 is a diagram showing a relationship between a frequency of an input signal and the efficiency of the DCDC converter element, which explains the efficiency of the DCDC converter according to the first embodiment of the invention.

FIG. 5 is a diagram showing a relationship between a frequency of an input signal when using a transistor and the efficiency of the DCDC converter (the horizontal axis is represented by an exponential scale). In contrast, if the efficiency of the DCDC converter element 31 is 90%, the efficiency of the DCDC converter element 32 is 50%, the power density of a signal component Sd1 that is input to the DCDC converter element 31 is 50%, the power density of a signal component Sd2 that is input to the DCDC converter element 32 is 50%, and the efficiency of the adder is 95%, the total efficiency of the DCDC converter 1 according to the first embodiment is represented by the following equation.

$$\begin{aligned}\text{Power efficiency} &= (\text{efficiency of DCDC converter element 31*power density of signal component that is input to DCDC converter element 31} \\ &+ \text{efficiency of DCDC converter element 32*power density of signal component that is input to DCDC converter element 32})*\text{efficiency of adder} \\ &= (90\%*50\%+50\%*50\%)*95\%=66.5\%\end{aligned} \quad (1)$$

That is, the efficiency of the DCDC converter 1 according to the first embodiment is 66.5%.

In the meantime, according to the related art that does not split a frequency of an input signal, a single DCDC converter needs to process the entire applicable frequency band component of an input signal. Therefore, the DCDC converter corresponding to the DCDC converter element 32 is used. However, since the efficiency of the DCDC converter element 32 is 50%, the efficiency of the DCDC converter according to the related art is 50%. As a result, according to the embodiment of the invention, the efficiency of the DCDC converter is improved by 16.5%.

Further, if the signal splitting unit 2 performs the same operation, the signal splitting unit does not need to have the configuration shown in FIG. 3. The DCDC converter elements also may use a configuration other than the class-S amplifier. Furthermore, the DCDC converter element 32 does not need to have the same characteristic as the DCDC converter element that processes the entire applicable frequency component according to the related art, and may set a parameter having a high conversion efficiency for the high band component Sd2.

The signal splitting unit may include a predetermined number of band pass filters in addition to the low pass filter and the high pass filter, and split a broadband frequency into three or more frequency bands. Even in this case, the components of the DCDC converter that correspond to the respective band filters, for example, the PMOS transistor and the NMOS transistor, that configure the inverter, have a parameter that is set to optimize the efficiency at the respective frequency bands. Therefore, it is possible to increase the efficiency of each of the DCDC converter elements and thus improve the efficiency of the DCDC converter.

According to the first embodiment, it is possible to provide a high efficiency DCDC converter in a high speed and broadband wireless system.

Second Embodiment

Figure 6:
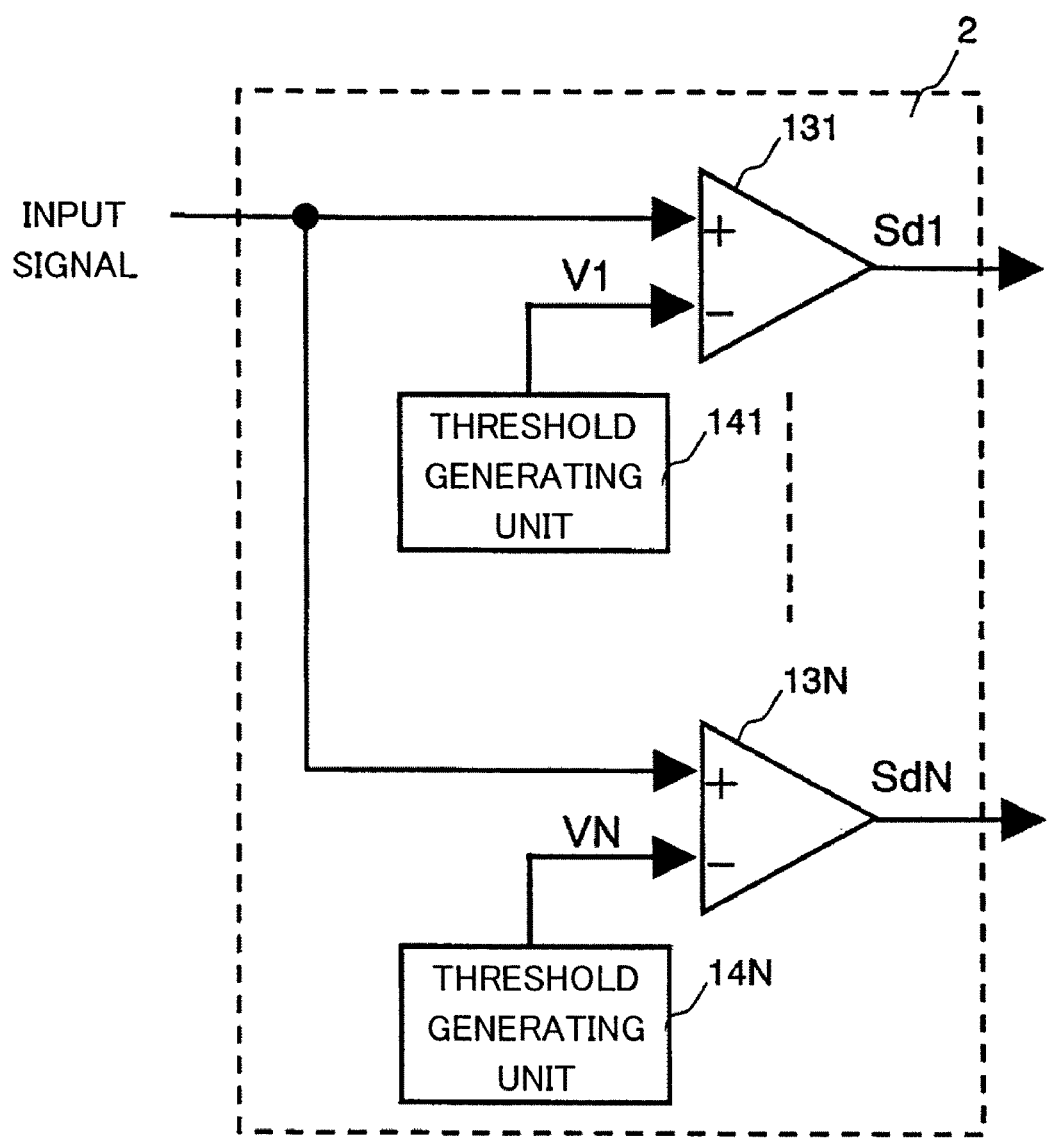
FIG. 6 is a diagram showing a configuration example of a signal splitting unit according to a second embodiment of the invention.

Next, a second embodiment according to the invention will be described with reference to FIGS. 6 to 8. The second embodiment relates to another configuration example of the signal splitting unit 2 of the DCDC converter shown in FIG. 1. The configuration of the signal splitting unit 2 is shown in FIG. 6. The signal splitting unit 2 according to the second embodiment is configured by N comparator elements 131 to 13N and N threshold generating units 141 to 14N. Signal components Sd1 to SdN obtained by comparing an input signal with threshold values by the N comparator elements 131 to 13N are output. Therefore, an amplitude component of the input signal is split into N components.

Figure 7A:
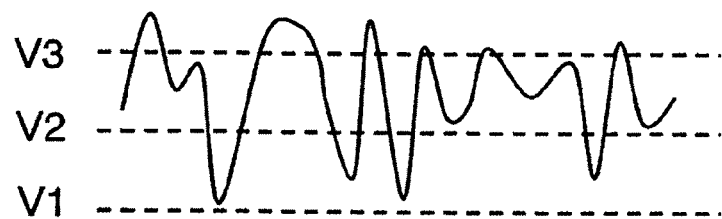
FIGS. 7A and 7B are diagrams showing a relationship between the waveforms of an input signal and an output signal, which explains an operation of the signal splitting unit shown in FIG. 6.
Figure 7B:
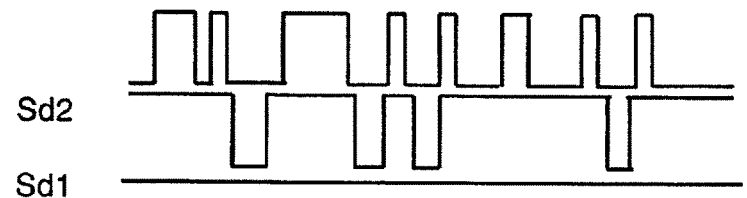

FIGS. 7A and 7B show operation examples when the signal splitting unit 2 according to the second embodiment includes three comparator elements. As shown in FIG. 7A, the input signal is split into amplitude components on the basis of three threshold values V1, V2, and V3. The three comparator elements output square waves shown in FIG. 7B by comparing the input signal with the threshold values V1, V2, and V3. In this case, since the threshold value V1 has a lower level than the input signal, a DC component is output as a signal component Sd1. Further, the signal components Sd2 and Sd3 are not DC components, but signals that shift to predetermined frequencies.

The signal components Sd1, Sd2, and Sd3 are input to the DCDC converter elements 31 to 33, and the output signals Sc1, Sc2, and Sc3 are added by an adder 4 to serve as an output signal. The output signal is obtained by amplifying the input signal.

In this case, since the signal components Sd1 is a DC component, the efficiency of the DCDC converter element 31 to which the signal component Sd1 is input is almost 100%. Even though the DCDC converter elements 32 and 33 to which the signal components Sd2 and Sd3 are input have poor efficiencies, since the efficiency of the DCDC converter element 31 is significantly good, the entire efficiency of the DCDC converter 1 according to the second embodiment is improved as compared with the configuration configured by the single DCDC converter element according to the related art.

Figure 8:
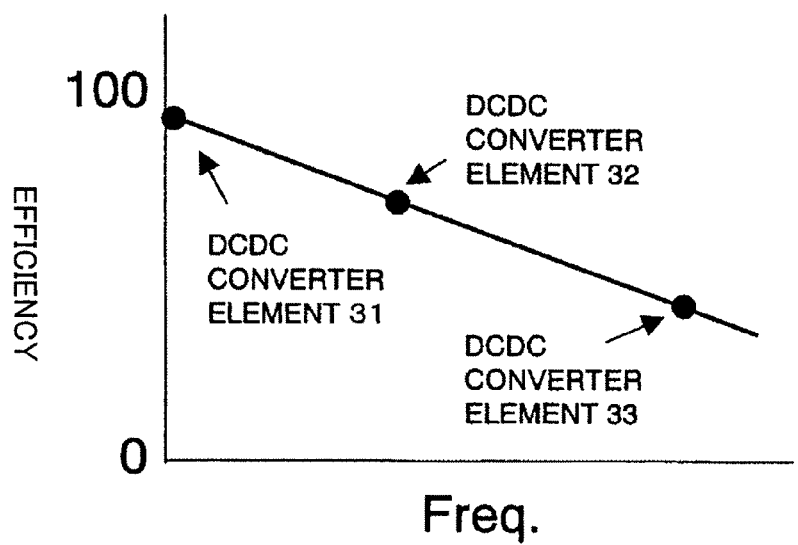
FIG. 8 is a diagram showing a relationship between a frequency of an input signal and the efficiency of the DCDC converter element, which explains the efficiency of the DCDC converter according to the second embodiment of the invention.

That is, referring to FIG. 8, if the efficiency of the DCDC converter element 31 is 100%, the efficiency of the DCDC converter element 32 is 60%, the efficiency of the DCDC converter element 33 is 20%, the power density of an input signal component is ⅓, and the efficiency of the adder is 95%, the total efficiency of the DCDC converter 1 according to the second embodiment is represented by the following equation (2).

$$\text{Power efficiency}=(100\%*\tfrac{1}{3}+60\%*\tfrac{1}{3}+20\%*\tfrac{1}{3})*95\%=57\% \quad (2)$$

Therefore, since the efficiency of the DCDC converter element 33 is 20%, the efficiency of the DCDC converter according to the related art is also 20%. As a result, according to the second embodiment of the invention, the efficiency of the DCDC converter is improved by 37%.

The signal splitting unit 2 is not limited to the configuration shown in FIG. 6, if it is possible to realize the same operation.

According to the second embodiment, it is possible to provide a high efficiency DCDC converter in the high speed broadband wireless system.

Third Embodiment

Figure 9:
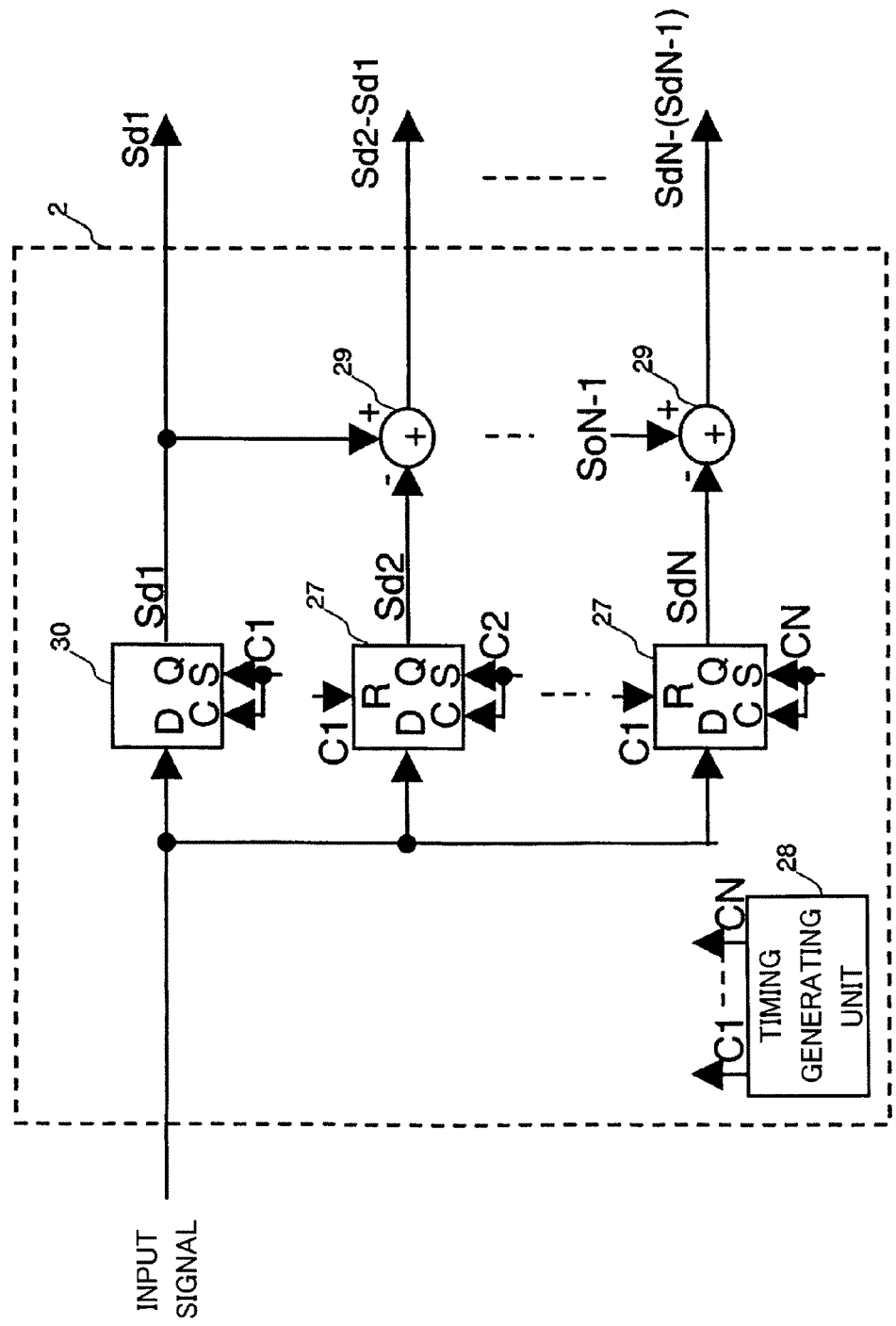
FIG. 9 is a diagram showing a configuration example of a signal splitting unit according to a third embodiment of the invention.

Next, a third embodiment according to the invention will be described with reference to FIGS. 9 to 11. The third embodiment relates to still another configuration example of the signal splitting unit 2 of the DCDC converter shown in FIG. 1. Referring to FIG. 9, the signal splitting unit 2 is configured by a timing generating unit 28, a set flipflop 30, N-1 set-reset flipflops 27, and N-1 subtractors 29. A phase of an input signal is split into N signal components Sd1 to SdN.

Figure 10:
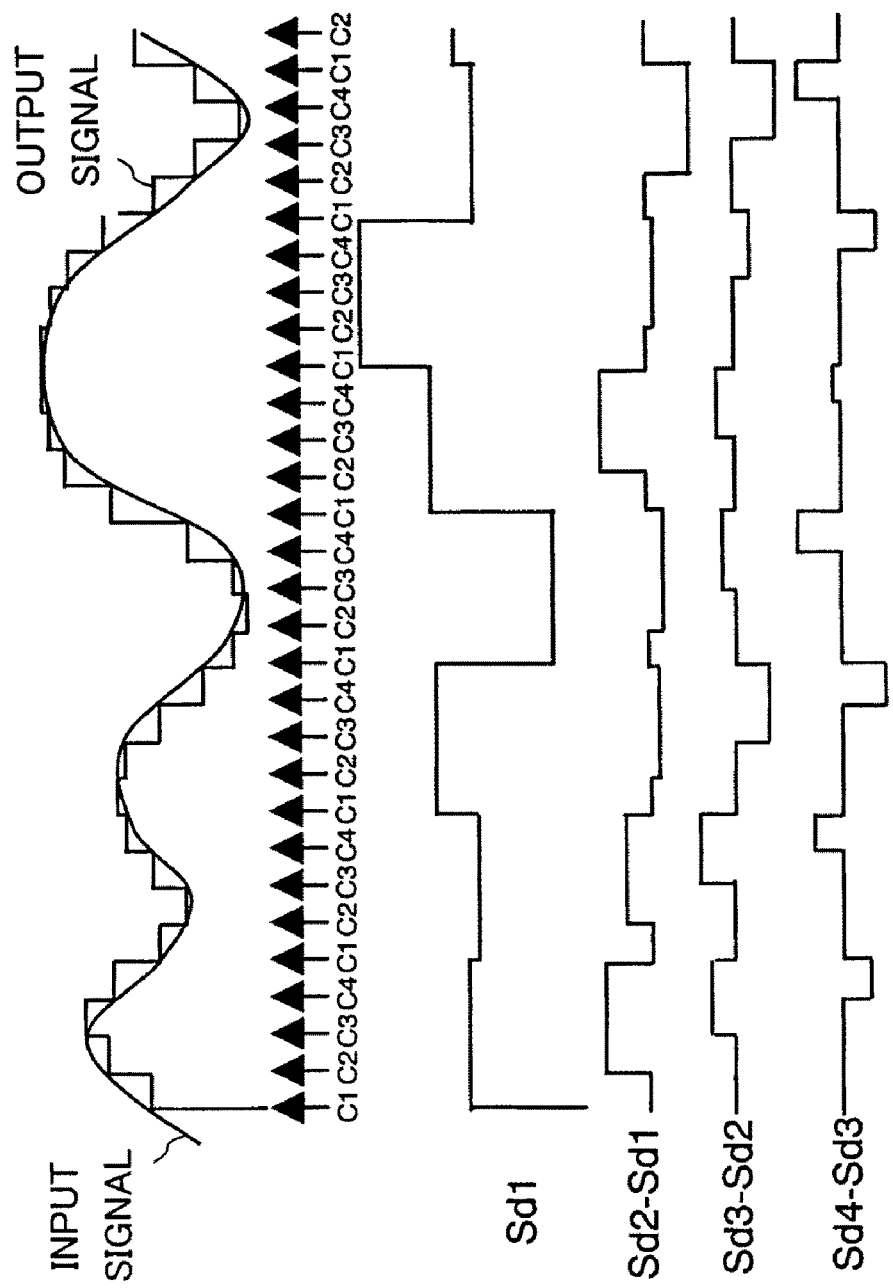
FIG. 10 is a diagram showing a signal waveform, which explains an operation of the signal splitting unit shown in FIG. 9.

FIG. 10 shows an operation example of the signal splitting unit 2 that splits the input signal into four signal components according to the third embodiment shown in FIG. 9. Amplitude information of the input signal is extracted by the set flipflop 30 at a timing of C1. The amplitude information Sd1 extracted by the set flipflop 30 is maintained by a timing of a rising edge of the subsequent C1.

Next, amplitude information Sd2 of the input signal is extracted by the set-reset flipflop 27 at a timing of C2, and is maintained by a timing of a rising edge of the subsequent C1. The amplitude information Sd1 and Sd2 are subtracted by the subtractor 29 to be output as a difference signal Sd2−Sd1. Similarly, amplitude information Sd3 and Sd4 of the input signal are extracted at timings of C3 and C4, and difference signals Sd3−Sd2, and Sd4−Sd3 are generated and output.

The signals components Sd1, Sd2−Sd1, Sd3−Sd2, and Sd4−Sd3 that are output using the amplitude information by the signal splitting unit 2 shown in FIG. 9 are then input to first to fourth DCDC converter elements, respectively, and then added by the adder to be output as output signals.

As is seen from FIG. 10, it is possible to decrease frequencies of the signal components Sd1 and Sd3−Sd2. Further, even though the signal components Sd2−Sd1 and Sd4−Sd3 may also have fast frequency component, since the amount of shift in the amplitude direction is small, the load for the DCDC converter is small, which improves the efficiency.

Figure 11:
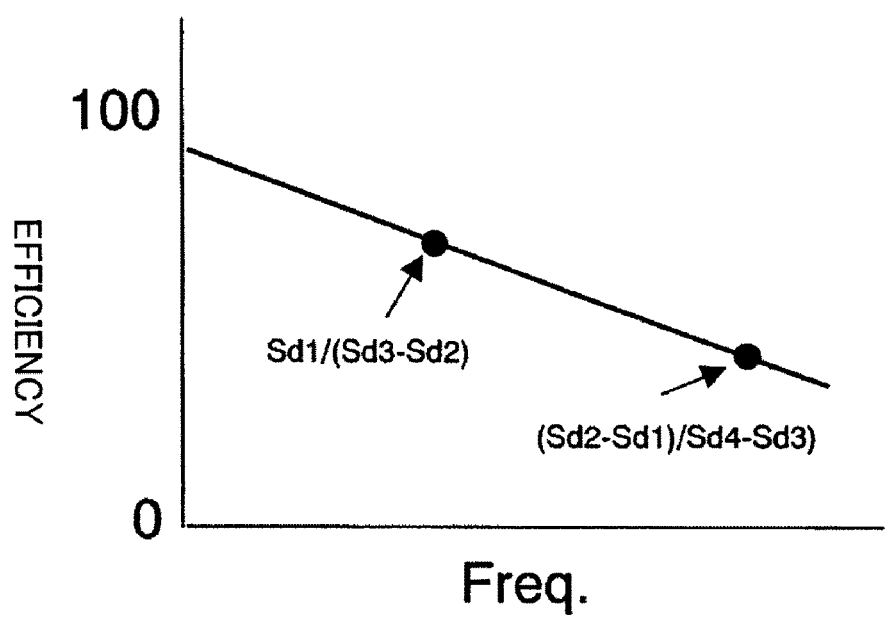
FIG. 11 is a diagram showing a relationship between a frequency of an input signal and the efficiency of the DCDC converter element, which explains the efficiency of the DCDC converter according to the third embodiment of the invention.

That is, referring to FIG. 11, if the efficiencies of the first and third DCDC converter elements are 60%, the efficiencies of the second and fourth DCDC converter elements are 20%, the power densities of input signal components are ¼, and the efficiency of the adder is 95%, the total efficiency of the DCDC converter 1 according to the third embodiment is represented by the following equation (3).

$$\text{Power efficiency}=(60\%*\tfrac{1}{4}+60\%*\tfrac{1}{4}+20\%*\tfrac{1}{4}+20\%*\tfrac{1}{4})*95\%=41\% \quad (3)$$

Therefore, since the efficiencies of the second and fourth DCDC converter elements are 20%, the efficiency of the DCDC converter according to the related art is also 20%. As a result, according to the third embodiment of the invention, the efficiency of the DCDC converter is improved by 21%.

Further, the signal splitting unit 2 is not limited to the configuration shown in FIG. 9, if it is possible to realize the same operation. Further, the filter may split the broadband frequency into three or more frequency bands.

According to the third embodiment, it is possible to provide a high efficiency DCDC converter in the high speed broadband wireless system.

Fourth Embodiment

Next, a fourth embodiment according to the invention will be described with reference to FIGS. 12 and 13. The fourth embodiment relates to still another configuration example of the signal splitting unit 2 of the DCDC converter shown in FIG. 1. A signal splitting unit 2 according to the fourth embodiment is a combined use of the signal splitting unit for frequency splitting shown in FIG. 3 and the signal splitting unit for amplitude splitting shown in FIG. 6.

Figure 12:
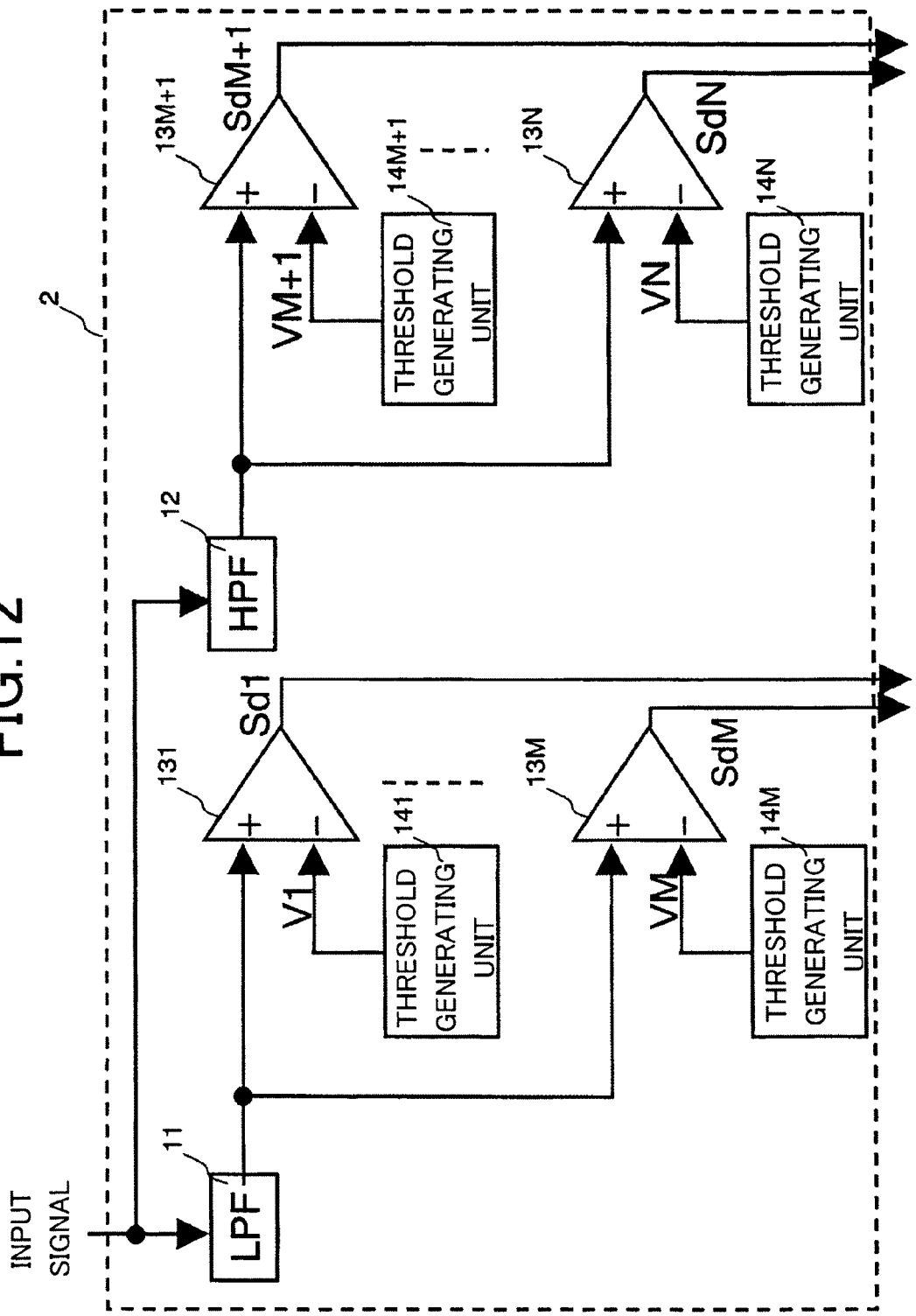
FIG. 12 is a diagram showing a configuration example of a signal splitting unit according to a fourth embodiment of the invention.

The signal splitting unit 2 shown in FIG. 12 includes a low pass filter 11, a high pass filter 12, comparators 131 to 13N, and threshold generating units 141 to 14N.

Figure 13:
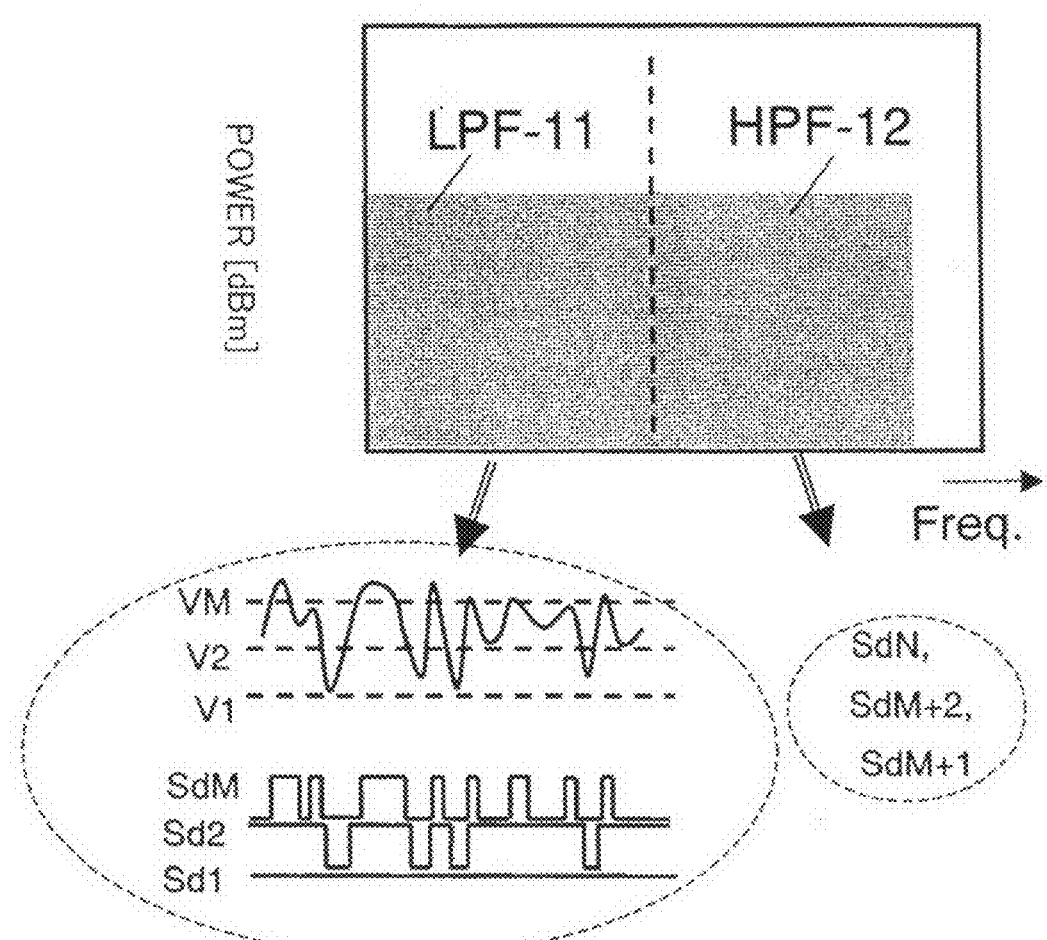
FIG. 13 is a diagram showing an operation of the signal splitting unit shown in FIG. 12.

As shown in FIGS. 12 and 13, a frequency of an input signal is split by the low pass filter 11 and the high pass filter 12. Thereafter, an amplitude of a low frequency component are split by the comparators 131 to 13M, and an amplitude of a high frequency component are split by the comparators 13M+1 to 13N. The generated signal components Sd1 to SdM and SdM+1 to SdN are input to corresponding DCDC converter elements that are designed to have a parameter to make the efficiency good at a predetermined frequency and amplified. Thereafter, the outputs are added by an adder 4 to be output as an output signal of the DCDC converter 1.

Further, the signal splitting unit 2 is not limited to the configuration shown in FIG. 12, if it is possible to realize the same operation. Further, the filter may split the broadband frequency into three or more frequency bands.

According to the fourth embodiment, it is possible to provide a high efficiency DCDC converter in the high speed broadband wireless system.

Fifth Embodiment

Figure 14:
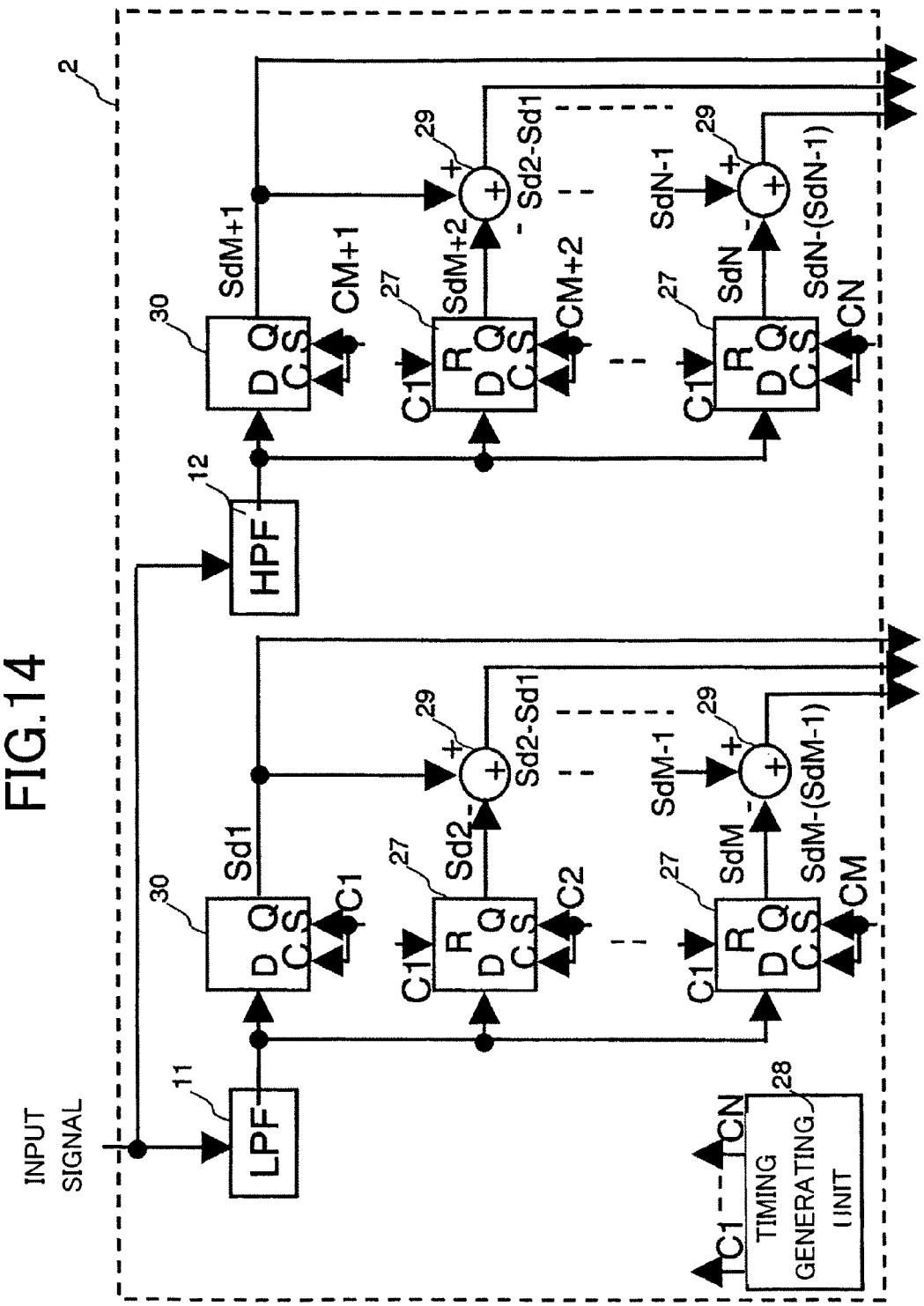
FIG. 14 is a diagram showing a configuration example of a signal splitting unit according to a fifth embodiment of the invention.

Next, FIG. 14 shows a fifth configuration example of the signal splitting unit 2 shown in FIG. 1. A signal splitting unit 2 according to the fifth embodiment is a combined use of the signal splitting unit for frequency splitting shown in FIG. 3 and the signal splitting unit for amplitude and phase splitting shown in FIG. 9. The signal splitting unit 2 includes a low pass filter 11, a high pass filter 12, a timing generating unit 28, set flipflops 30, N-1 set-reset flipflops 27, and N-1 subtractors 29. A frequency of an input signal is split by the low pass filter 11 and the high pass filter 12. Thereafter, amplitudes and phases of low frequency components are split by the set flipflop 30, the M set-reset flipflops 27, and the M subtractors. Further, amplitudes and phases of high frequency components are split by the set flipflop 30, the M set-reset flipflops 27, and the M subtractors. The output signal components are input to corresponding DCDC converter elements that are configured to have a good efficiency at a predetermined frequency, and amplified. Thereafter, the outputs are added by the adder 4 to be output as an output signal of the DCDC converter 1.

Further, the signal splitting unit 2 is not limited to the configuration shown in FIG. 14, if it is possible to realize the same operation. Further, the filter may split the broadband frequency into three or more frequency bands.

According to the fifth embodiment, it is possible to provide a high efficiency DCDC converter in the high speed and broadband wireless system.

Sixth Embodiment

An EER amplifier according to a sixth embodiment of the invention will be described with reference to FIG. 15.

Figure 15:
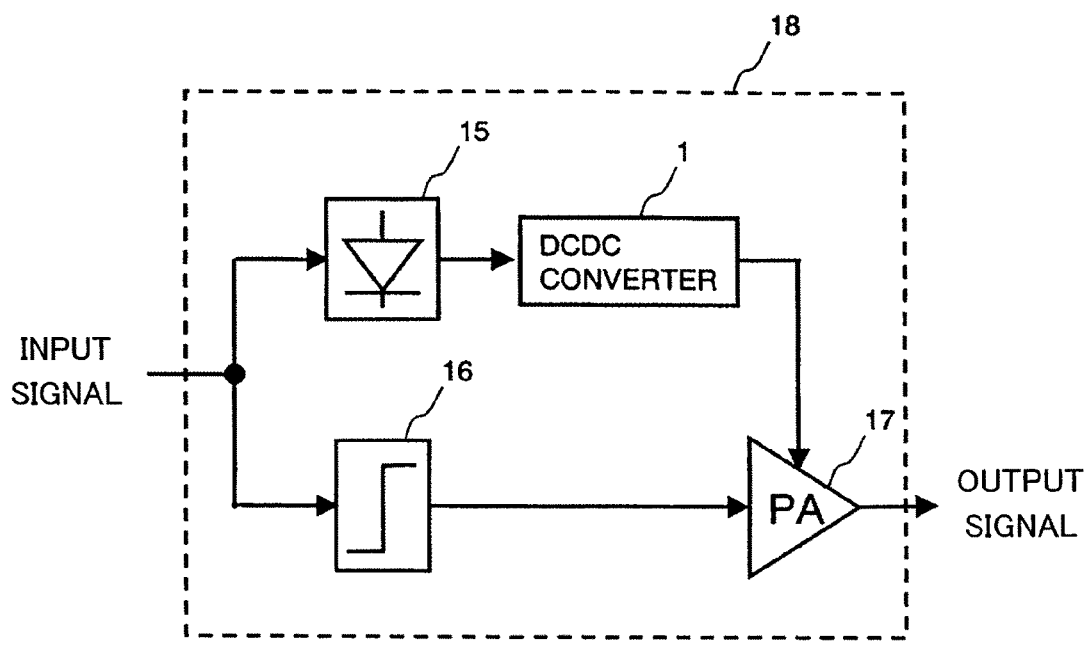
FIG. 15 is a block diagram showing an EER amplifier according to a sixth embodiment of the invention.

The EER amplifier shown in FIG. 15 is an EER amplifier that uses the DCDC converter 1 according to the above embodiments. The EER amplifier 18 includes an envelope detector 15, a limiter 16, a DCDC converter 1, and a carrier amplifier 17. The DCDC converter 1 is configured by the DCDC converter elements according to the above embodiments.

Next, the operation of the EER amplifier will be described.

Amplitude information AM of an input signal that is a high frequency signal is extracted by the envelope detector 15. Further, phase information PM of the input signal is extracted by the limiter 16. The amplitude information is amplified by the DCDC converter 1 and then supplied to a power supply terminal of the carrier amplifier 17. Further, the phase information is supplied to an input terminal of the carrier amplifier 17.

Even though the amplitude information of the input signal is temporarily absorbed by the limiter 16, the amplitude information is supplied to the power supply terminal of the carrier amplifier 17. Accordingly, the absorbed amplitude information is recovered by the carrier amplifier 17. Since the EER amplifier 18 is designed to allow the carrier amplifier 17 to be saturated without using the input power and the DCDC converter 1 that amplifies the amplitude information has a high efficiency, the entire system has a high efficiency.

That is, even though in a communication system such as WiMAX, the used frequency reaches several tens MHz and a broadband signal is input, the DCDC converter 1 that amplifies the amplitude information splits the frequency band of the input signal into plural components. Then, each of the signals is input to corresponding DCDC converter elements that have a good efficiency at a predetermined frequency band. Accordingly, even though the operating frequency is high, it is possible to prevent the lowering of the power efficiency. Therefore, it is further possible to obtain an EER amplifier having high conversion efficiency sufficient to be applied to a base station at a broad operation frequency band of several hundreds of kHz to 100 MHz.

As described above, the EER amplifier according to the sixth embodiment uses a DCDC converter 1 according to the above embodiments. Therefore, even though a broadband amplitude modulated signal such as WiMAX that cannot be processed by the class-S amplifier according to the related art is input, it is possible to realize the high efficiency operation.

Further, in order to correct the AM-PM distortion or AM-AM distortion, the feedback operation that compares the output signal and the input signal of the carrier amplifier 17 may be performed. Furthermore, predistortion may be performed.

According to the sixth embodiment, it is possible to provide a highly efficient power amplifier in the high speed broadband wireless system.

Seventh Embodiment

Figure 16:
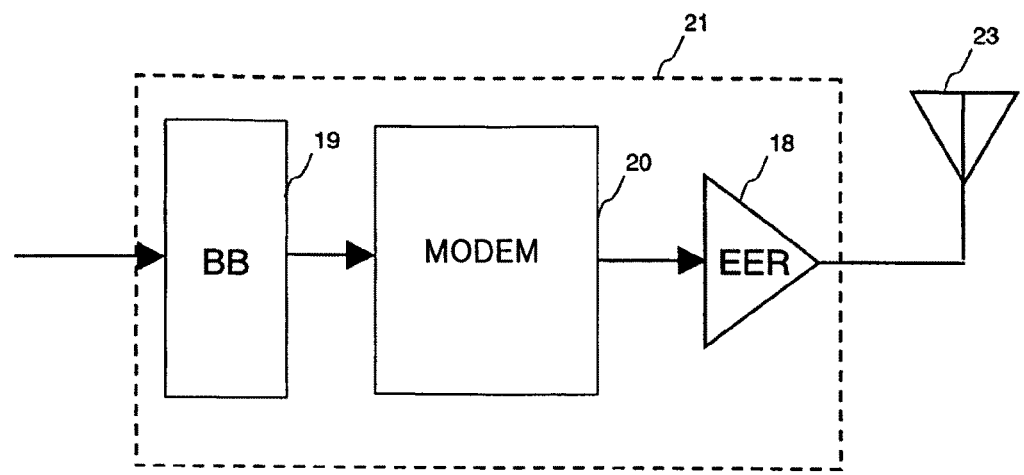
FIG. 16 is a block diagram showing a base station according to a seventh embodiment of the invention.
Figure 17:
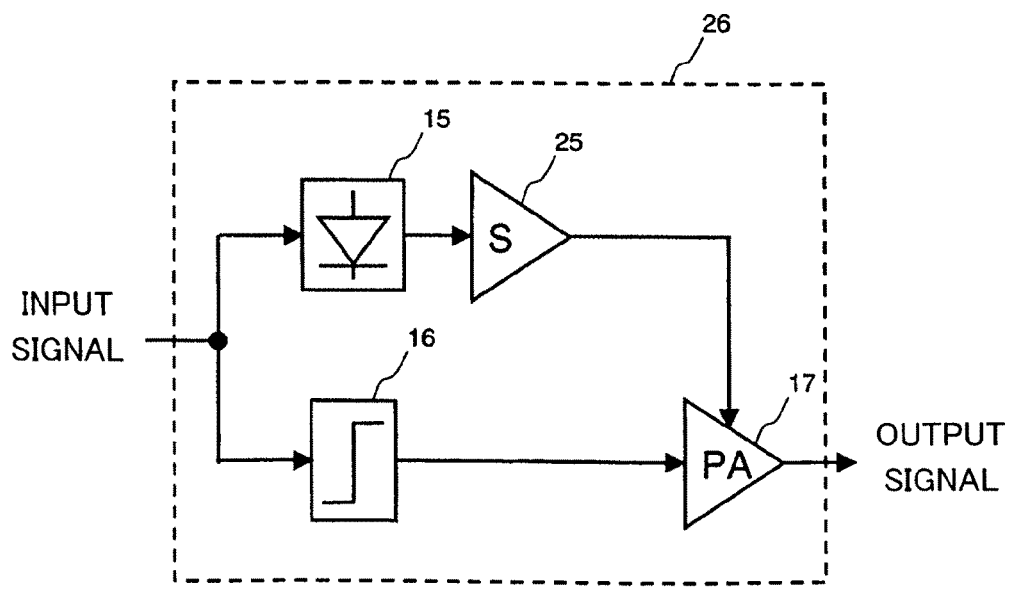
FIG. 17 is a block diagram showing an EER amplifier according to a related art.

Next, a base station according to a seventh embodiment of the invention will be described with reference to FIG. 16. The base station 21 shown in FIG. 16 is a base station that uses an EER amplifier according to the sixth embodiment. The base station 21 includes a base band unit 19, a modem 20, and an EER amplifier 18.

Transmission information is processed in the base band unit 19, and then modulated by the modem 20. Therefore, the information is amplified by the EER amplifier 18 to be transmitted to an antenna 23. Since the EER amplifier 18 is an EER amplifier that uses a DCDC converter 1 according to any of the above embodiments, it is possible to realize the highly efficient operation even in a broadband wireless system such as WiMAX that can not processed by the EER amplifier according to the related art.

Further, predistortion that inputs an output signal of the EER amplifier 18 to the base band unit 19 to correct the distortion may be performed.

According to the seventh embodiment, it is possible to provide a highly efficient base station in the high speed broadband wireless system.

Further, the broadband and highly efficient DCDC converter and the amplifier using the same may be broadly applied to a portable terminal, a terminal built in a vehicle, a terminal mounted in a digital household electrical appliance, and other wireless communication systems that process broadband and high speed signals, in addition to the base band.

What is claimed is:

1. A DCDC converter unit comprising:
   a signal splitting unit that splits an input signal into a plurality of signal components;
   a plurality of DCDC converter elements that have different characteristics for frequency bands; and
   an adder that adds outputs from the plurality of DCDC converter elements to generate an output signal,
   wherein each of the plurality of signal components is input to any of the DCDC converter elements that has a characteristic corresponding to a frequency of a corresponding signal component.

2. The DCDC converter unit according to claim 1,
   wherein the plurality of DCDC converter elements has different DCDC conversion efficiencies with respect to frequency bands, and
   wherein each of the plurality of signal components is input to any of the DCDC converter elements that has high conversion efficiency at the frequency of the corresponding signal component.

3. The DCDC converter unit according to claim 1,
   wherein the signal splitting unit splits a frequency component of the input signal into the plurality of signal components.

4. The DCDC converter unit according to claim 1,
   wherein the signal splitting unit splits an amplitude component of the input signal into the plurality of signal components, and
   wherein each of the signal components is input to any of the DCDC converter elements that has a characteristic corresponding to the frequency of the corresponding signal component.

5. The DCDC converter unit according to claim 4,
   wherein the signal splitting unit includes:
   N (N is a natural number) threshold generating units that generate threshold values; and
   N comparators that compare the input signal with the threshold values generated by the N threshold generating units to output the comparison signals, and
   wherein the signal splitting unit splits the input signal in an amplitude direction.

6. The DCDC converter unit according to claim 1,
   wherein the signal splitting unit splits an amplitude component and a phase component of the input signal into the plurality of signal components, and
   wherein each of the signal components is input to any of DCDC converter elements that has a characteristic corresponding to the frequency of the corresponding signal component.

7. The DCDC converter unit according to claim 6,
   wherein the signal splitting unit includes:
   N flipflops to which the input signal is input;
   a timing generating unit that generates timings when the N flipflops extract amplitude information; and
   N-1 subtractors that input first amplitude information extracted by the N flipflops at the generated timings and second amplitude information extracted by the N flipflops at subsequent timings, and generate different signals between the first amplitude information and the second amplitude information, and
   wherein the signal splitting unit, from the input signal input to the N flipflops, extracts amplitude information at timings generated by the timing generating unit, outputs the amplitude information extracted at the first timing, and inputs the amplitude information extracted at the timings and the amplitude information extracted at the subsequent timings to the subtractors to generate different signals.

8. The DCDC converter unit according to claim 1,
   wherein the signal splitting unit splits a frequency component of the input signal and then an amplitude component of the input signal, and
   wherein each of the signal components is input to any of the DCDC converter elements that has a characteristic corresponding to the frequency of the corresponding signal component.

9. The DCDC converter unit according to claim 8,
   wherein the signal splitting unit includes:
   a low pass filter that extracts a low frequency component that is lower than a predetermined frequency from the frequency components of the input signal;
   a high pass filter that extracts a high frequency component that is equal to or higher than the predetermined frequency from the frequency components of the input signal;
   N threshold generating units that generate threshold values; and
   N comparators that compare the low frequency component and the high frequency component with the threshold values generated by the N threshold generating units, and outputs the comparison signal according to the result, and
   wherein the signal splitting unit splits the frequency component of the input signal and the amplitude component of the input signal.

10. The DCDC converter unit according to claim 1,
    wherein the signal splitting unit splits a frequency component of the input signal and then an amplitude component and a phase component of the input signal, and
    wherein each of the signal components is input to any of DCDC converter elements that has a characteristic corresponding to the frequency of the corresponding signal component.

11. The DCDC converter unit according to claim 10,
    wherein the signal splitting unit includes:
    a low pass filter that extracts a low frequency component that is lower than a predetermined frequency from the frequency components of the input signal;
    a high pass filter that extracts a high frequency component that is equal to or higher than the predetermined frequency from the frequency components of the input signal;
    N flipflops to which the low frequency component output by the low pass filter and the high frequency component output by the high pass filter are input;
    a timing generating unit that generates timings when the amplitude information of the input signal is extracted; and
    N-1 subtractors that input first amplitude information extracted by the N flipflops at the generated timings and second amplitude information extracted by the N flipflops at subsequent timings, and output different signals between the first amplitude information and the second amplitude information, and wherein the signal splitting unit splits a frequency component of the input signal, and further an amplitude component and a phase component of the input signal.

12. The DCDC converter unit according to claim 1, wherein each of the DCDC converter elements includes:
a triangle wave generating unit that generates a triangle wave;
a comparator that compares the triangle wave with the input signal components to output square waves;
an inverter that inversely amplifies the square waves to output; and
a filter that extracts an output waveform passing through a predetermined frequency band within an applicable frequency band range from an output waveform of the inverter and output the extracted output waveform, and
wherein the inverter and the filter have a parameter that is set to allow the efficiency of the DCDC converter elements at the predetermined frequency band to be larger than the efficiency at the other frequency band within the applicable frequency band range.

13. The DCDC converter unit according to claim 1, wherein the signal splitting unit includes a low pass filter and a high pass filter.

14. The DCDC converter unit according to claim 1, wherein the signal splitting unit includes a low pass filter, a high pass filter, and at least one band pass filter.

15. A power amplifier comprising:
an envelope detecting unit that extracts amplitude information of an input signal;
a limiter that extracts phase information of the input signal;
a DCDC converter unit that processes the detected output signal of the envelope detecting unit; and
a carrier amplifier that amplifies power of the input signal using a limiter output signal from the limiter as an input and a conversion output signal of the DCDC converter unit as a power supply,
wherein the DCDC converter unit includes:
a signal splitting unit that splits the detected output signal into a plurality of signal components;
a plurality of DCDC converter elements that have characteristics that have different efficiencies for frequency bands; and
an adder that adds outputs from the plurality of DCDC converter elements to generate the conversion output signal, and
wherein each of the plurality of signal components is input to any of the DCDC converter elements that has a characteristic corresponding to a frequency of a corresponding signal component.

16. The power amplifier according to claim 15, wherein the signal splitting unit splits a frequency component of the detected output signal into the plurality of signal components.

17. The power amplifier according to claim 15, wherein the signal splitting unit splits an amplitude component of the input signal into the plurality of signal components, and
wherein each of the signal components is input to any of the DCDC converter elements that has a characteristic corresponding to a frequency of the corresponding signal component.

18. The power amplifier according to claim 15, wherein the signal splitting unit splits an amplitude component and a phase component of the input signal into the plurality of signal components, and
wherein each of the signal components is input to any of the DCDC converter elements that has a characteristic corresponding to a frequency of the corresponding signal component.

19. A base station comprising:
a base band unit that processes transmission information;
a modem that modulates and demodulates the signal processed by the base band unit; and
a power amplifier that amplifies the power of the signal processed by the modem to output to an antenna,
wherein the power amplifier includes:
an envelope detecting unit that extracts amplitude information of an input signal;
a limiter that extracts phase information of the input signal;
a DCDC converter unit that processes the detected output signal of the envelope detecting unit; and
a carrier amplifier that amplifies power of the input signal using a limiter output signal from the limiter as an input and a conversion output signal of the DCDC converter unit as a power supply,
wherein the DCDC converter unit includes:
a signal splitting unit that splits the detected output signal into a plurality of signal components;
a plurality of DCDC converter elements that have characteristics that have different efficiencies for frequency bands; and
an adder that adds outputs from the plurality of DCDC converter elements to generate the conversion output signal, and
wherein each of the signal components is input to any of DCDC converter elements that has a characteristic corresponding to a frequency of the corresponding signal component.

20. The base station according to claim 19, wherein the signal splitting unit splits a frequency component of the detected output signal into the plurality of signal components,
wherein the plurality of DCDC converter elements have different DCDC conversion efficiencies for frequency bands, and
wherein each of the plurality of signal components is input to any of the DCDC converter elements that has high conversion efficiency for a frequency of a corresponding signal component.

* * * * *